United States Patent [19]

Uchida et al.

[11] Patent Number: 5,472,646
[45] Date of Patent: Dec. 5, 1995

[54] METHOD FOR FABRICATING A TRANSFER MODEL OPTICAL SEMICONDUCTOR APPARATUS

[75] Inventors: Hirofumi Uchida, Yamato-Koriyama; Kazuya Fujita, Nabari, both of Japan

[73] Assignee: Sharp Kabushiki Kaisha, Osaka, Japan

[21] Appl. No.: 8,138

[22] Filed: Jan. 25, 1993

Related U.S. Application Data

[63] Continuation of Ser. No. 742,759, Aug. 9, 1991, abandoned.

[30] Foreign Application Priority Data

Aug. 27, 1990 [JP] Japan ................. 2-224709

[51] Int. Cl.⁶ ............. B29C 45/02; B29C 45/14
[52] U.S. Cl. ............. 264/1.7; 264/272.15; 264/272.17; 264/275; 264/328.4
[58] Field of Search .......... 264/272.15, 272.17, 264/272.11, 328.4, 328.12, 265, 271.1, 275, 1.7

[56] References Cited

U.S. PATENT DOCUMENTS

| | | | |
|---|---|---|---|
| Re. 32,364 | 2/1987 | Carmien | 294/57 |
| 657,422 | 9/1900 | Judd | 294/49 |
| 1,374,336 | 4/1921 | Surbaugh | 294/57 |
| 1,755,236 | 4/1930 | Brandenburg | 294/57 |
| 2,031,556 | 2/1936 | Brandenburg | 294/49 |
| 2,052,616 | 9/1936 | Gardes . | |
| 2,063,774 | 12/1936 | William | 294/49 |
| 2,238,104 | 4/1941 | Finley | 294/57 |
| 2,517,902 | 8/1950 | Luebkeman | 264/225 |
| 2,948,649 | 8/1960 | Pancherz . | |
| 3,018,140 | 1/1962 | Portz et al. . | |
| 3,232,355 | 2/1966 | Woolworth . | |
| 3,549,189 | 12/1970 | Alosi | 294/57 |
| 3,556,888 | 1/1971 | Goldsworthy | 156/73 |
| 3,620,159 | 11/1971 | Gould | 101/28 |
| 3,762,453 | 10/1973 | Merrow et al. | 145/61 C |
| 4,039,012 | 8/1977 | Cook | 145/29 R |
| 4,043,027 | 8/1977 | Birchler et al. | 264/272.17 |
| 4,050,727 | 9/1977 | Bonnes | 294/49 |
| 4,424,183 | 1/1984 | Nelson | 264/221 |
| 4,451,073 | 5/1984 | Carmien | 294/57 |
| 4,570,988 | 2/1986 | Carmien | 294/57 |
| 4,605,254 | 8/1986 | Carmien | 294/57 |
| 4,639,029 | 1/1987 | Kolonia | 294/57 |
| 4,641,418 | 2/1987 | Meddles | 264/272.17 |
| 4,697,481 | 10/1987 | Maeda | 81/22 |
| 4,743,481 | 5/1988 | Quinlan et al. | 428/36 |
| 4,801,561 | 1/1989 | Sankhagowit | 264/272.15 |
| 4,812,420 | 3/1989 | Matsuda et al. | 264/272.17 |
| 4,900,501 | 2/1990 | Saeki et al. | 264/272.17 |
| 5,008,733 | 4/1991 | Mine et al. | 357/72 |
| 5,070,041 | 12/1991 | Katayama et al. | 357/70 |
| 5,098,626 | 3/1992 | Pas | 264/272.17 |
| 5,123,304 | 6/1992 | Carmien | 76/111 |
| 5,204,122 | 4/1993 | Konishi | 264/272.17 |
| 5,254,501 | 10/1993 | Tung | 264/272.17 |
| 5,262,113 | 11/1993 | Carmien | 264/257 |
| 5,275,546 | 1/1994 | Fierkens | 264/272.17 |

FOREIGN PATENT DOCUMENTS

| | | | |
|---|---|---|---|
| 2555098A | 5/1985 | France . | |
| 5243366 | 4/1977 | Japan | 264/272.17 |
| 129611 | 10/1950 | Sweden | 264/249 |
| 3424 | of 1882 | United Kingdom . | |
| 1376180 | 12/1974 | United Kingdom | 264/249 |
| 2093398 | 9/1992 | United Kingdom | 264/279 |
| PCT/SE84/00036 | 2/1984 | WIPO | 264/317 |

*Primary Examiner*—Jan H. Silbaugh
*Assistant Examiner*—Angela Ortiz
*Attorney, Agent, or Firm*—Nixon & Vanderhye

[57] ABSTRACT

A transfer molded semiconductor method arranges a semiconductor chip on a flat die pad so that, at least one predetermined edge surface of the semiconductor chip extends or protrudes over a corresponding edge of the flat die pad. The predetermined edge of the die pad is arranged on the opposite side of a gate beneath a lead frame at the other side. The arrangement suppresses the formation of voids at a side surface of the semiconductor chip, e.g., the side surface opposite the gate at which resin is injected.

2 Claims, 2 Drawing Sheets

METHOD FOR FABRICATING A TRANSFER MODEL OPTICAL SEMICONDUCTOR APPARATUS

This is a continuation of application Ser. No. 07/742,759, filed Aug. 9, 1991 now abandoned.

BACKGROUND OF THE INVENTION

1. Field of the Invention

The invention relates to a semiconductor apparatus packaged by transfer mold method.

2. Description of the Related Art

In a conventional semiconductor apparatus packaged by transfer mold method, the size of each side of a die pad of a lead frame is designed to be not less than 0.5 mm larger than each side of a semiconductor chip to be mounted, so that when a semiconductor chip is mounted on the die pad, each edge surface of the chip is located interior to each edge side of the die pad. This is to prevent adhesive from flowing out of the die pad toward the exterior even if the adhesive protrudes to some extent when a semiconductor chip is mounted by bonding.

FIG. 1 shows a state wherein resin is molded and cured by transfer mold method for fabricating such a semiconductor apparatus. In FIG. 1, a part of the figure is omitted for ease in understanding.

In FIG. 1, 10 denotes a lead frame, 11 its die pad, 12 a semiconductor chip bonded onto the die pad 11, 13 a metallic mold for molding resin used for transfer molding, and 14 a gate of the metallic mold for injecting resin. Inside the metallic mold 13, resin for the packaging member is press-injected and cured.

As described above, according to the conventional semiconductor apparatus, bonding is achieved in such a manner that each edge surfaces of a semiconductor chip 12 is located interior to each edge side of the die pad 11. As a result, there has been a problem in that voids 15 (air bubbles) generated when resin is injected cannot escape easily and cure as they are. Especially, the voids tend to be generated easily at a position of a dead angle of the gate 14 for injecting resin, that is, on the edge surface 12a of the semiconductor chip 12 located on the opposite side of the gale 14 for injecting resin. When the resin is cured and voids 15 are formed, the reliability of the semiconductor apparatus is lowered. Particularly in an optical semiconductor apparatus such as CCD (Charge Coupled Device) or the like which is molded using transparent resin, the formation on the voids has great influence such as causing inferior appearance and the like, so that production yield decreases greatly.

SUMMARY OF THE INVENTION

It is therefore an object of the present invention to provide a semiconductor apparatus which suppresses the formation of voids on the side surface of a semiconductor chip generated at packaging by the transfer mold method.

According to the present invention the above object is achieved by a semiconductor apparatus provided with a semiconductor chip, a lead frame having a die pad on which the semiconductor chip is mounted, and a packaging member made of thermosetting resin in which the semiconductor chip and the lead frame are molded, wherein the semiconductor chip is mounted on the die pad so that at least one predetermined edge surface thereof is located on or exterior to a corresponding edge side of the die pad.

Since at least one predetermined edge surface of the semiconductor chip on which voids tend to be formed, that is, a position lying in a dead angle of the gate for injecting resin, for example, the edge surface located on the opposing side of the gate for injecting resin, is positioned on the corresponding edge side of the die pad or exterior to it, the voids generated can escape easily before curing, so chat the formation of voids on the side surface of the semiconductor chip can be suppressed.

Further objects and advantages of the present invention will be apparatus from the following description of the preferred embodiments of the invention as illustrated in the accompanying drawings.

DESCRIPTION OF THE PREFERRED EMBODIMENTS

Figure 1:
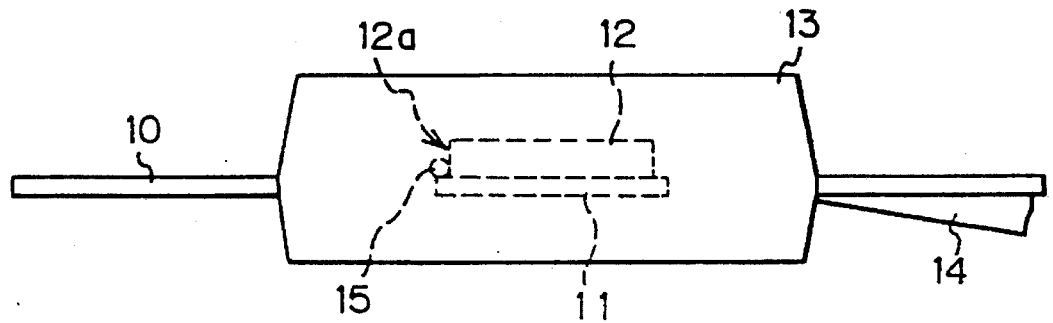
FIG. 1 shows a state wherein resin is molded and cured by transfer mold method in order to fabricate the aforementioned semiconductor apparatus.
Figure 2:
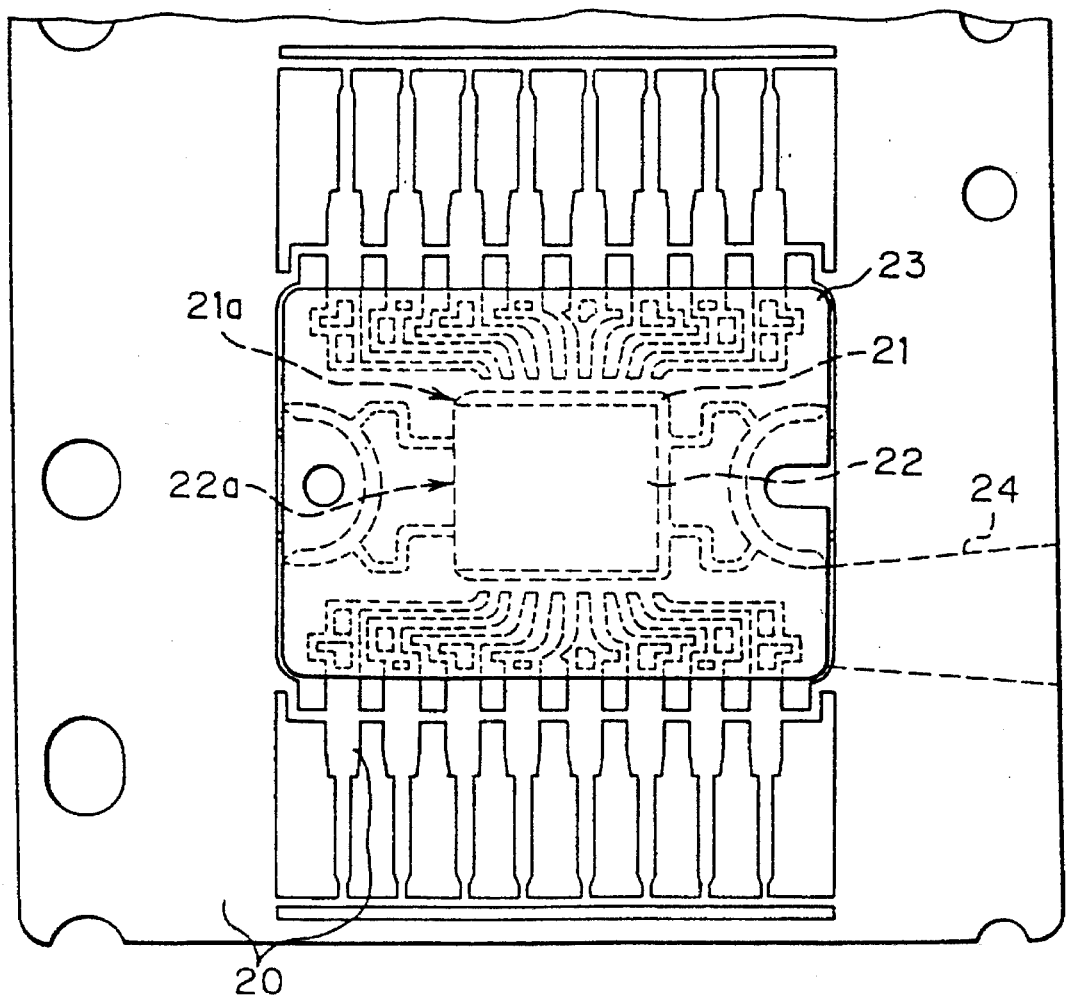
FIG. 2 is a plane delineation showing a state wherein resin is molded and cured by transfer mold method in order to fabricate a semiconductor apparatus of a preferred embodiment of the present invention.
Figure 3:
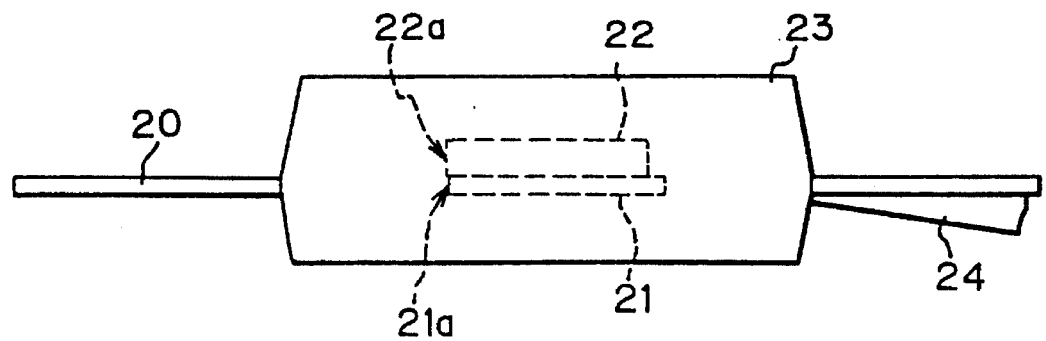
FIG. 3 shows a front view of the embodiment of FIG. 2.

FIGS. 2 and 3 are a plane view and a front view, respectively, each showing a preferred embodiment of the present invention, wherein thermosetting transparent resin is molded and cured by transfer mold method in order fabricate an optical semiconductor apparatus such as CCD or the like. In FIG. 3, a part of the figure is omitted for ease in understanding.

In both figures, 20 denotes a lead frame, 21 its die pad, 22 a semiconductor chip bonded onto the die pad 21, 23 a metallic mold for molding resin to be used for transfer molding, and 24 a gate of the metallic mold 23 for injecting the transparent resin. Inside the metallic mold 23, transparent resin for packaging member is press-injected and cured.

The semiconductor chip 22 is bonded onto the die pad 21 in such a manner that an edge surface 22a positioned at the opposite side of the gate 24 for injecting resin, of the semiconductor chip 22 protrudes or extends over a corresponding edge side 21a of the die pad 21. Although voids tend to be generated on the edge surface 22a since it is located at a position of dead angle of the gate 24 for injecting resin, the voids generated can escape quite easily before the transparent resin cures by providing such a shape as described above. As a result, the formation of voids on the side surface of the semiconductor chip in transfer mold method can surely be suppressed, Herein, when the semiconductor chip 22 is bonded onto the die pad 21, the amount of adhesive should be controlled so that it does not protrude out of the die pad 21.

Depending on the position of the gate 24 for injecting resin, a plurality of edge surfaces may be located on the opposite side of the gate 24 for injecting resin.

Figure 4:
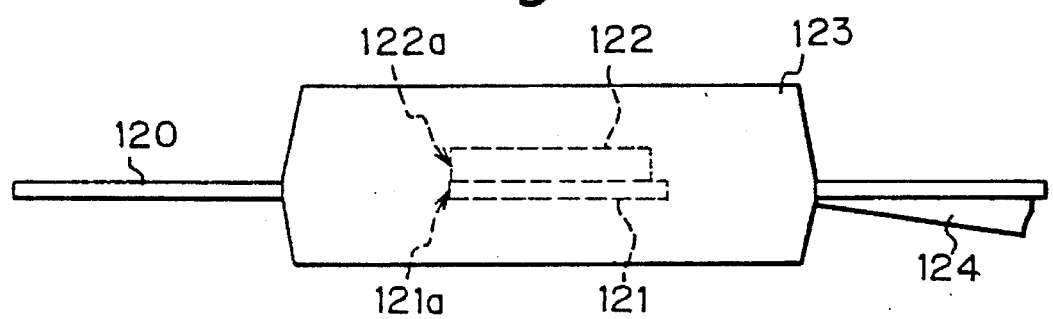
FIG. 4 shows a front view of another embodiment of the present invention.

As another embodiment of the invention, FIG. 4 is a elevation showing a state wherein thermosetting transparent resin is molded and cured by transfer mold method in order to fabricate an optical semiconductor apparatus such as CCD or the like. In FIG. 2, the edge surface 22a of the semiconductor chip 22 protrudes or extends over the corresponding edge side 21a of the die pad 21. In contrast to this, a corresponding edge surface 122a is constructed so as to be located just above the edge side 121a in this embodiment.

That is, in FIG. 4, 120 denotes a lead frame, 121 its die pad, 122 a semiconductor chip bonded onto the die pad 121, 123 a metallic mold for molding resin to be used for transfer mold, and 124 a gate of the metallic mold 123 for injecting transparent resin. Inside the metallic mold 123, transparent resin for packaging member is press-injected and cured.

The semiconductor chip 122 is bonded onto the die pad 121 in such a manner that the edge surface 122a of the semiconductor chip 122 located on the opposite side of the gate 124 for injecting resin is positioned just on the corresponding edge side 121a of the die pad 121. Since this edge surface 122a is located at a position of dead angle of the gate 124 for injecting resin, voids tend to be generated. However, by providing such a shape as described above, the voids generated can escape quite easily before the transparent resin is cured. As a result, the formation of voids on the side surface of a semiconductor chip in transfer mold method is suppressed. When the semiconductor chip 122 is bonded onto the die pad 121, the amount of adhesive should be controlled so that it does not protrude out of the die pad 121.

Figure 5:
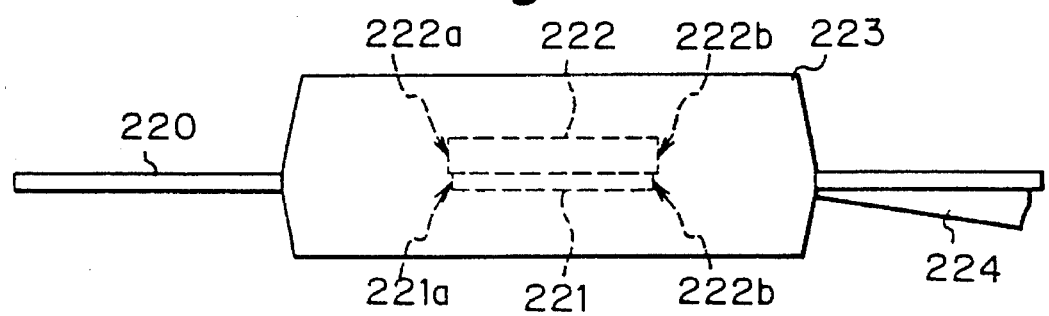
FIG. 5 shows a front view of still another embodiment of the present invention.

As still another embodiment of the invention, FIG. 5 is a elevation showing a state wherein the thermosetting transparent resin is molded and cured by the transfer mold method to fabricate an optical semiconductor apparatus such as CCD or the like. In the embodiment of FIG. 2, the edge surface 22a of the semiconductor chip 22 located on the opposite side of the gate 24 for injecting resin protrudes or extends over the corresponding edge side 21a of the die pad 21. In contrast to this, not only does a corresponding edge surface 222a protrude over edge surface 221a but also another edge surface 222b protrudes over the edge side 221b.

That is, in FIG. 5, 220 denotes a lead frame, 221 its die pad, 222 a semiconductor chip bonded onto the die pad 221, 223 a metallic mold for molding resin to be used for transfer mold, and 224 a gate of the metallic mold 223 for injecting transparent resin. Inside the metallic mold 223, transparent resin for packaging member is press-injected and cured.

The semiconductor chip 222 is bonded onto the die pad 221 in such a manner that not only the edge surface 222a of the semiconductor chip 222 located on the opposite side of the gate 224 for injecting resin but also at least another edge surface 222b protrude outer than the edge side 221b. By providing such a shape as described above regarding not only the edge surface 222a located at a position of dead angle of the gate 124 for injecting resin but also another edge surface 222b, the position of the gate 224 for injecting resin to the semiconductor chip 222 can be set as desired. Of course, the formation of voids on the side surface of the semiconductor chip in transfer mold method is suppressed. However, when the semiconductor ship 222 is bonded onto the die pad 221, the amount of adhesive should be controlled so that it does not protrude out of the die pad 221.

Figure 6:
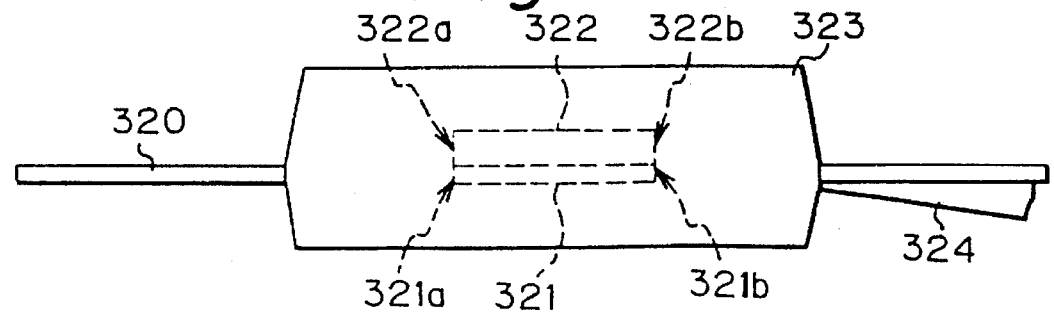
FIG. 6 shows a front view of yet another embodiment of the present invention.

As yet another embodiment of the invention, FIG. 6 is a elevation showing a state wherein thermosetting transparent resin is molded and cured by transfer mold method in order to fabricate an optical semiconductor apparatus such as CCD or the like. In the embodiment of FIG. 5, the edge surfaces 222a and 222b of the semiconductor 222 each protrude or extend over the corresponding edge sides 221a and 221b of the die pad 221. In contrast to this, corresponding edge surfaces 322a and 322b of them are constructed in such a manner that they are positioned just above the respective sides 321a and 321b in this embodiment.

That is, in FIG. 6, 320 denotes a lead frame, 321 its die pad, 322 a semiconductor chip bonded onto the die pad 321, 323 a metallic mold for molding resin to be used for transfer mold, and 324 a gone of the metallic mold 323 for injecting transparent resin. Inside the metallic mold 323, transparent resin for a packaging member is press-injected and cured.

The semiconductor chip 322 is bonded onto the die pad 321 in such a manner that not only the edge surface 322a of the semiconductor chip 322 located on the opposite side of the gate 324 for injecting resin but also at least another edge surface 322b are positioned just above on the edge side 321b. By providing such a shape as described above regarding not the edge surface 322a located at a position of dead angle the gate 324 for injecting resin but also another edge surface 322b, the position of the gate 324 for injecting resin to the semiconductor chip 322 can be set as desired. Of course, the formation of voids on the side surface of the semiconductor chip in transfer mold method is suppressed. However, when the semiconductor chip 322 is bonded onto the die pad 321, the amount of adhesive should be controlled so that it does not protrude out of the die pad 321.

As described above in detail, according to the invention, since a semiconductor chip is mounted on a die pad so that at least one predetermined edge surface of the semiconductor chip is positioned on a corresponding edge side of the die pad or extending over it, the formation of voids on the side surface of the semiconductor chip to be packaged by transfer mold method can be suppressed. Therefore, the reliability of semiconductor apparatuses can be improved, and particularly in optical semiconductor apparatuses, production yield due to inferior in appearance can be improved to a large extent.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for fabricating a transfer molded optical semiconductor apparatus comprising:

mounting a photosensitive semiconductor chip on a flat die pad of a lead frame at one side thereof in such a manner that one edge of said semiconductor chip extends over a predetermined edge of said die pad and all other edges are located interior to said die pad;

setting a mold for packaging said semiconductor chip on said lead frame in such a manner that said predetermined edge of said die pad is arranged on an opposite side of a gate of said mold for injecting a resin, to preclude formation of voids about said chip and frame during a following injection of transparent thermosetting resin, said gate being positioned beneath the lead frame at another side thereof;

injecting transparent thermosetting resin into said mold through said gate thereof to form a transparent packaging member in which said semiconductor chip and lead frame are thus encapsulated without voids about said semiconductor chip and lead frame; and removing said mold to obtain a transfer molded optical semiconductor apparatus.

2. A method for fabricating a transfer molded optical semiconductor apparatus comprising:

mounting a photosensitive semiconductor chip on a flat die pad of a lead frame at one side thereof in such a manner that one edge of said semiconductor chip is flush with the predetermined edge of said die pad and all other edges are located interior to said die pad;

setting a mold for packaging said semiconductor chip on said lead frame in such a manner that said predetermined edge of said die pad is arranged on an opposite side of a gate of said mold for injecting a resin, to preclude formation of voids about said chip and frame during a following injection of transparent thermosetting resin, said gate being positioned beneath the lead frame at another side thereof;

injecting transparent thermosetting resin into said mold through said gate thereof to form a transparent packaging member in which said semiconductor chip and lead frame are thus encapsulated without voids about said semiconductor chip and lead frame; and removing said mold to obtain a transfer molded optical semiconductor apparatus.

* * * * *

UNITED STATES PATENT AND TRADEMARK OFFICE
CERTIFICATE OF CORRECTION

PATENT NO. : 5,472,646
DATED : December 5, 1995
INVENTOR(S) : UCHIDA et al

It is certified that error appears in the above-indentified patent and that said Letters Patent is hereby corrected as shown below:

On the title page, item [54], delete "MODEL" and insert -- MOLDED --.

Column 1, in the title of the invention, delete "MODEL" and insert -- MOLDED --.

Signed and Sealed this

Sixteenth Day of April, 1996

*Attest:*

BRUCE LEHMAN

*Attesting Officer*     *Commissioner of Patents and Trademarks*